(12) United States Patent
Kim

(10) Patent No.: US 7,598,110 B2
(45) Date of Patent: Oct. 6, 2009

(54) CMOS IMAGE SENSOR AND METHOD FOR MANUFACTURING THE SAME

(75) Inventor: Jea-Hee Kim, Gyeonggi-do (KR)

(73) Assignee: Dongbu HiTek Co., Ltd., Seoul (KR)

( * ) Notice: Subject to any disclaimer, the term of this patent is extended or adjusted under 35 U.S.C. 154(b) by 0 days.

(21) Appl. No.: 11/844,694

(22) Filed: Aug. 24, 2007

(65) Prior Publication Data

US 2008/0057613 A1 Mar. 6, 2008

(30) Foreign Application Priority Data

Aug. 29, 2006 (KR) .................. 10-2006-0082448

(51) Int. Cl.
*H01L 21/00* (2006.01)
*C03C 15/00* (2006.01)
*C03C 25/68* (2006.01)

(52) U.S. Cl. .................... 438/60; 216/91; 257/E21.617

(58) Field of Classification Search .................... 438/60, 438/551, 671, 701; 257/E21.438, E21.578, 257/E21.617, E21.622; 216/91

See application file for complete search history.

(56) References Cited

U.S. PATENT DOCUMENTS

| | | | | | |
|---|---|---|---|---|---|
| 4,931,144 | A | * | 6/1990 | Brighton | 174/262 |
| 6,040,593 | A | * | 3/2000 | Park | 257/292 |
| 6,793,836 | B2 | * | 9/2004 | Tsung-Kuei et al. | 216/83 |
| 7,238,562 | B2 | * | 7/2007 | Jang | 438/199 |
| 2001/0003030 | A1 | * | 6/2001 | Jung et al. | 430/273.1 |
| 2003/0196986 | A1 | * | 10/2003 | Tsung-Kuei et al. | 216/2 |
| 2006/0051974 | A1 | * | 3/2006 | French et al. | 438/764 |

* cited by examiner

*Primary Examiner*—W. David Coleman
(74) *Attorney, Agent, or Firm*—Sherr & Vaughn, PLLC

(57) ABSTRACT

A method for manufacturing a CMOS image sensor may include at least one of the following steps: Forming a salicide blocking layer on an entire surface of a semiconductor substrate having a photodiode area and a transistor. Forming a photoresist pattern inclined at an angle less 90° (e.g. between approximately 70° and approximately 80°) on and/or over a non-salicide area. Performing wet-etching on the salicide blocking layer using the photoresist pattern as an etching mask. Forming salicide on the salicide area after removing the photoresist pattern.

16 Claims, 8 Drawing Sheets

CMOS IMAGE SENSOR AND METHOD FOR MANUFACTURING THE SAME

This patent application claims priority under 35 U.S.C. 119 to Korean Patent Application No. 10-2006-0082448, filed on Aug. 29, 2006, which is hereby incorporated by reference in its entirety.

BACKGROUND

Some image sensors are semiconductor devices that convert optical images into electric signals. Two categories of image sensors are charge coupled devices (CCD) and complementary metal oxide semiconductor (CMOS) image sensors. A CCD may have MOS (Metal-Oxide-Silicon) capacitors that are relatively close to each other, that store and transfer charge carriers. A CMOS image sensor may employ a switching mode to detect an output by using MOS transistors. The MOS transistors may correspond to a number of pixels, that employ CMOS technology. Peripheral devices, such as a control circuit and a signal processing circuit, may work with the MOS transistors.

However, driving of CCD image sensors may be relatively complicated and have a relatively large power consumption. Forming a CCD image sensor may require multi-step mask processes, which may make it difficult to integrate a signal processing circuit on the same chip as a CCD. As a substitute for CCD image sensors, CMOS image sensors have been developed that mitigate some disadvantages of CCD image sensors. CMOS image sensors may utilize sub-micron CMOS technology.

CMOS image sensors may generate an image by sequentially detecting signals in a switching mode using photodiodes and MOS transistors in a pixel array. CMOS image sensors may consume relatively low power. CMOS image sensors may require a relatively small number of mask processes (e.g. which may require about 20 different masks), which makes a manufacturing process relatively simple compared to a manufacturing process for a CCD image sensor (e.g. which may require between 30-40 masks). Accordingly, signal processing circuits may be integrated into the same chip as CMOS image sensors, which may allow for a relatively compact product and maximize the number of applications.

Relatively highly integrated semiconductor devices may include self aligned silicide (salicide) technology to reduce resistance. Salicide technology may be implemented by simultaneously stacking refractory metal and applying a heat treatment on exposed portions of silicon and an insulating layer to form a salicide layer on a gate electrode and a source/drain. Salicide technology may be used in a semiconductor manufacturing process to reduce contact resistance of a transistor driving circuit.

CMOS image sensors may be manufactured using salicide technology to improve response speed. However, since a CMOS image sensor includes photodiodes that receive light, a salicide process should be performed selectively to prevent damage to the photodiodes from the salicide process.

Figure 1:
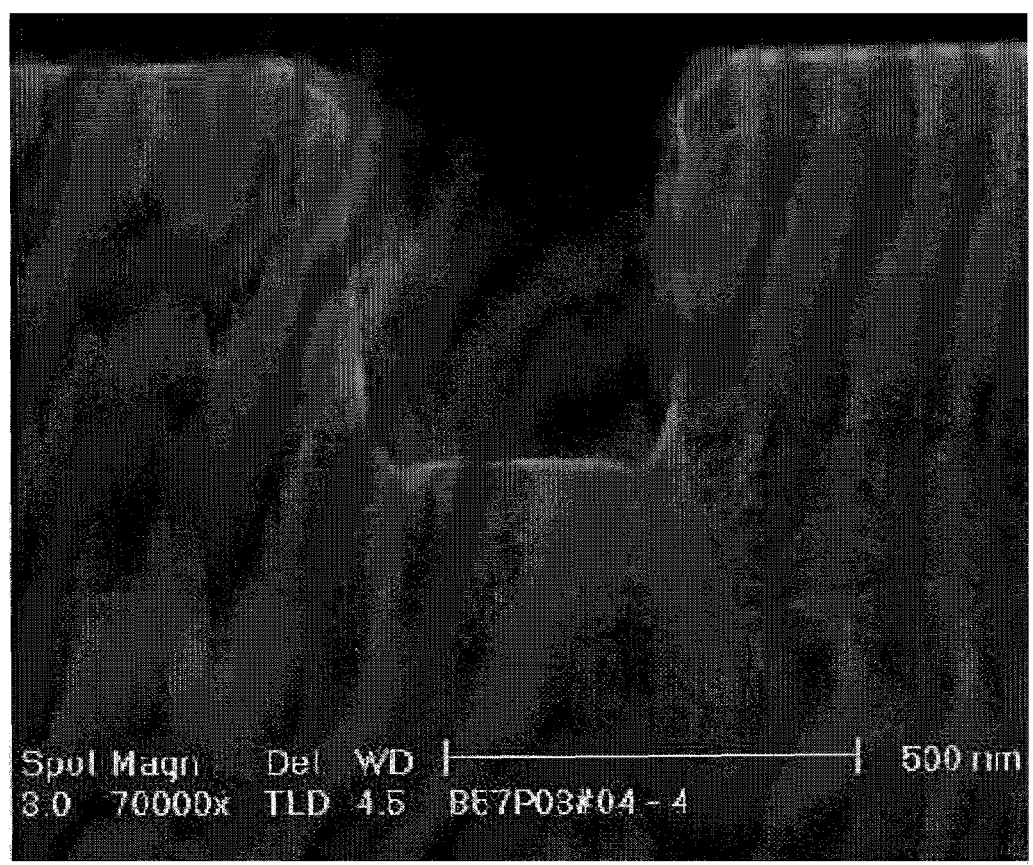
Figure 2:
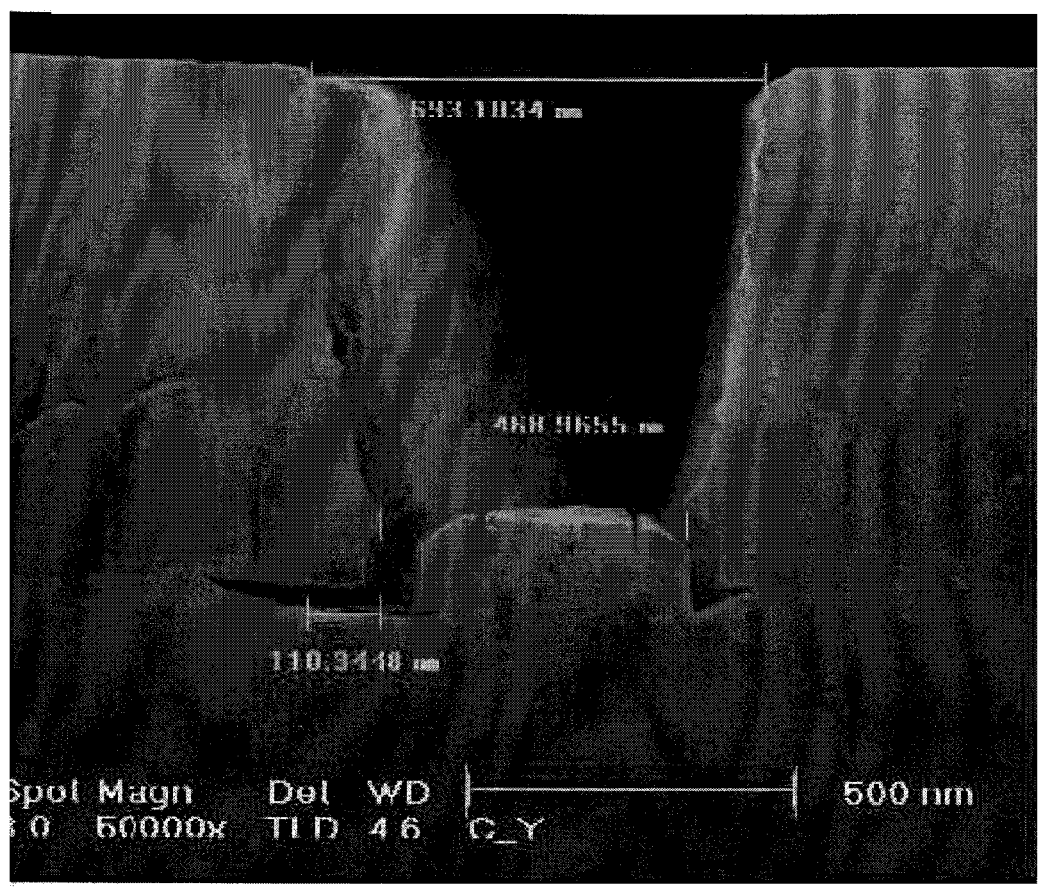

Example FIG. 1 illustrates a photoresist pattern in a salicide blocking layer. Example FIG. 2 illustrates an etching process that patterns a salicide blocking layer. When forming a photoresist pattern and performing wet etching on a salicide blocking layer, the slope of the photoresist pattern may approach approximately 90°. Accordingly, etchant may flow into an interfacial surface between the photoresist pattern and the salicide blocking layer, which may result in a salicide blocking layer being etched relatively deep.

As semiconductor technology has developed, design rules have become micro-sized, which may contribute to occurrence of an undercut phenomenon at the sides of a photoresist pattern. Undercutting may cause a pixel area to unintentionally include salicide, which may degrade characteristics of a CMOS image sensor. When salicide is formed in a photodiode, dark current may occur, which may cause a dark defect. When a wet etching process is performed with respect to a salicide blocking layer, undercutting may not be uniformly formed, since a semiconductor substrate may be rotated in one direction.

SUMMARY

Embodiments relate to a method of manufacturing a complementary metal oxide semiconductor (CMOS) image sensor with a non-salicide area and a salicide area defined through a salicide process. In embodiments, a CMOS image sensor may have maximized characteristics by adjusting the slope of a photoresist pattern used to form a salicide blocking layer.

In embodiments, a method for manufacturing a CMOS image sensor may include at least one of the following steps: Forming a salicide blocking layer on an entire surface of a semiconductor substrate having a photodiode area and a transistor. Forming a photoresist pattern inclined at an angle less 90° (e.g. between approximately 70° and approximately 80°) on and/or over a non-salicide area. Performing wet-etching on the salicide blocking layer using the photoresist pattern as an etching mask. Forming salicide on the salicide area after removing the photoresist pattern.

DRAWINGS

Example FIG. 1 illustrates a photoresist pattern used to form a salicide blocking layer.

Example FIG. 2 illustrates an etching process used to pattern a salicide blocking layer.

Example FIGS. 3A to 3F illustrate a method of manufacturing a CMOS image sensor, according to embodiments.

Figure 4:
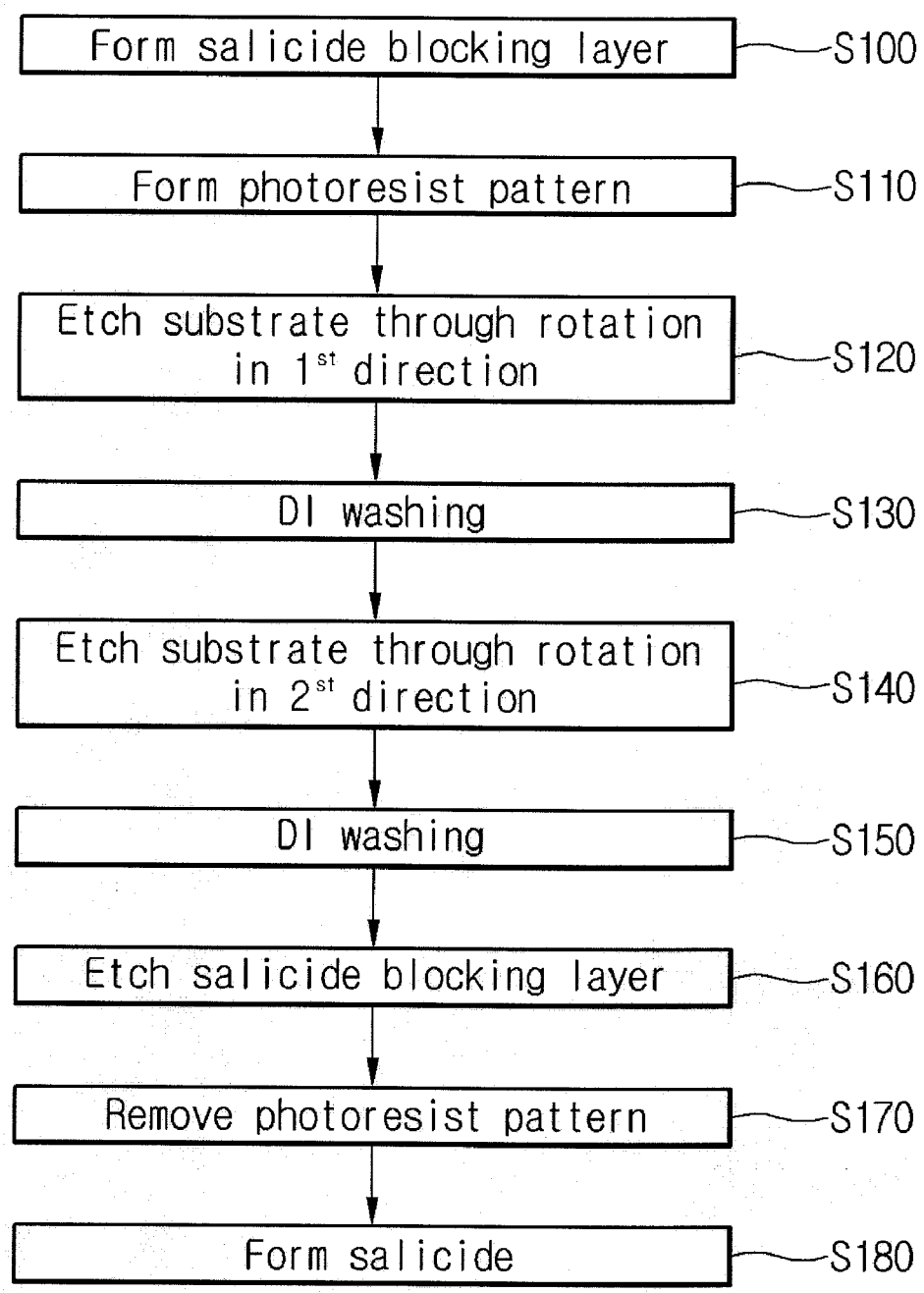

Example FIG. 4 is a flowchart illustrating a process of forming a salicide blocking layer in a method for manufacturing a CMOS image sensor, according to embodiments.

Figure 5:
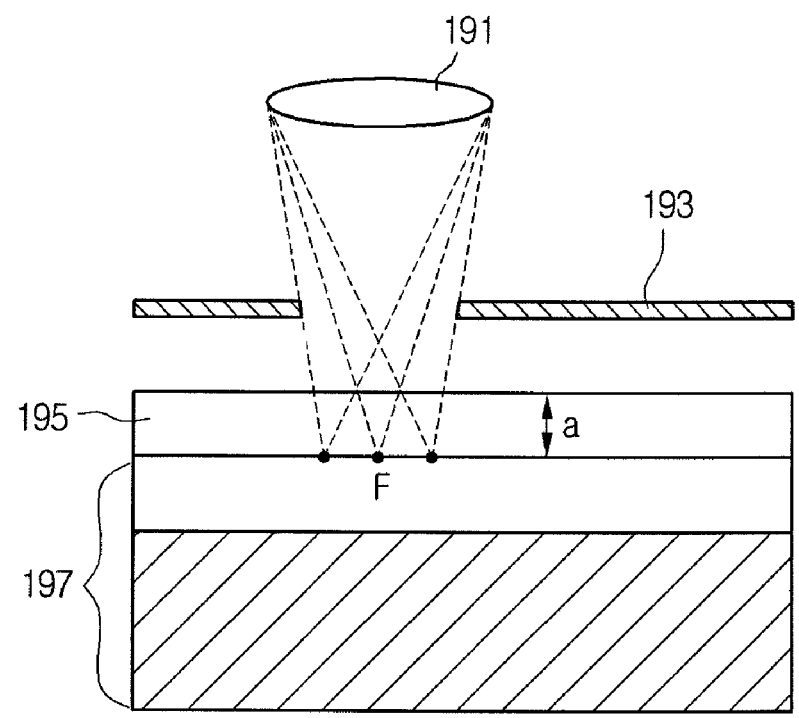

Example FIG. 5 illustrates an exposure process of forming a photoresist pattern, according to embodiments.

Figure 6:
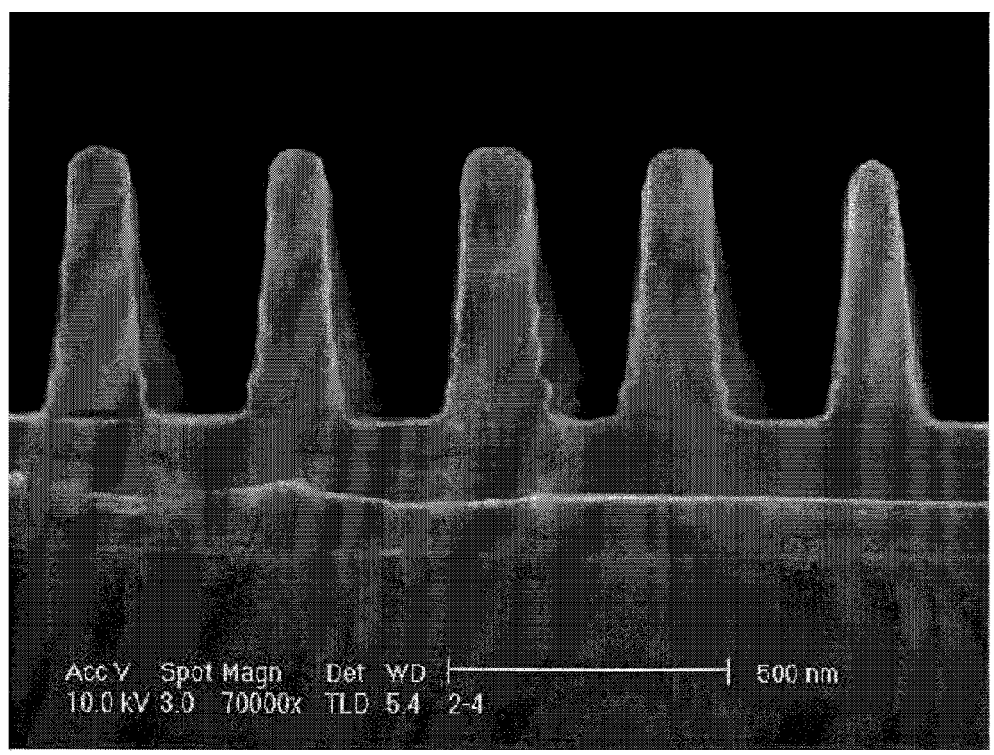

Example FIG. 6 illustrates a photoresist pattern, according to embodiments.

DESCRIPTION

Example FIGS. 3A to 3F are sectional views sequentially illustrating process steps for manufacturing a CMOS image sensor, according to embodiments. As illustrated in example FIG. 3A, gate insulating layer 122 and gate electrode 123 may be formed on and/or over a p-type semiconductor substrate (e.g. p++-sub) 101. Substrate 101 may have isolation layers 121 formed through a shallow trench isolation (STI) process.

In embodiments, a p-type epitaxial layer (p-epi) may be formed on and/or over the p-type semiconductor substrate 101, prior to forming gate insulating layer 122 and gate electrode 123. A first photoresist pattern 124 may be formed on and/or over a drain area at one side of gate electrode 123. Using first photoresist pattern 124 as a mask, an ion implantation process may be performed to form a low density impurity ion area 115 having a lightly doped drain (LDD) structure. In embodiments, the ion implantation process implants low density impurity ions (e.g. n-type impurity ions) into the entire surface of the p-type semiconductor substrate exposed by first photoresist pattern 124. Low density impurity ion area 115 may be a low density impurity ion area (LDD n−) having an LDD structure formed in a p-type semiconductor substrate, in accordance with embodiments. In embodiments, first photoresist pattern 124 covers gate electrode 123 so that ion implantation is not performed on gate electrode 123. First photoresist pattern 124 may then be removed.

Figure 3A:
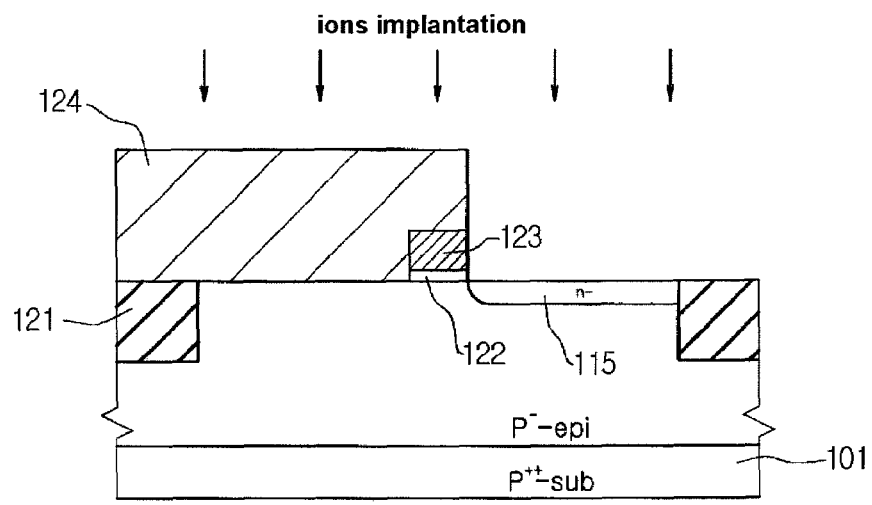
Figure 3B:
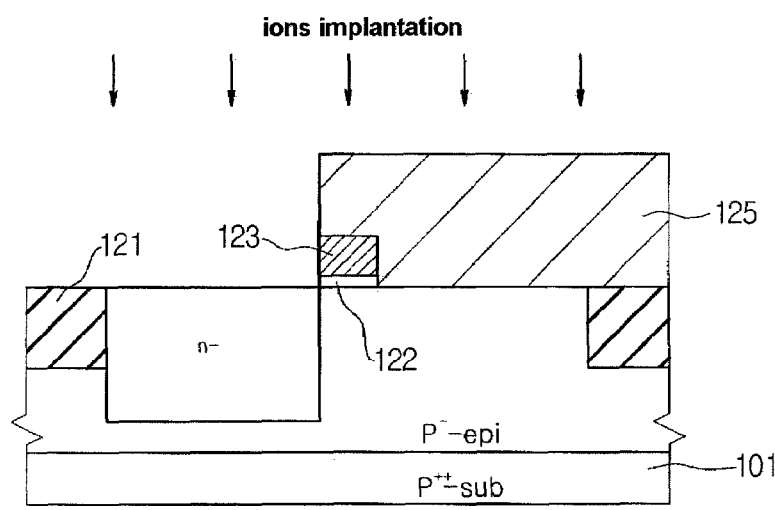

As illustrated in example FIG. 3B, a second photoresist pattern 125 may be formed, which does not expose low density impurity area (LDD n−) 115, in accordance with embodiments. Using second photoresist pattern 125 as a mask, a low density impurity area (n−) for a photodiode may be formed on the other side of gate electrode 123 (i.e. the other side relative to low density impurity ion area 115). Second photoresist pattern 125 may then be removed.

Figure 3C:
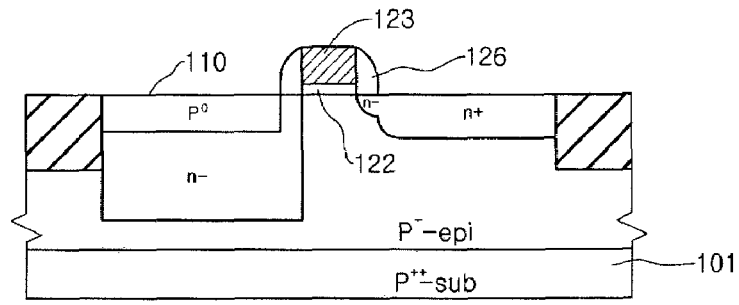
Figure 3D:
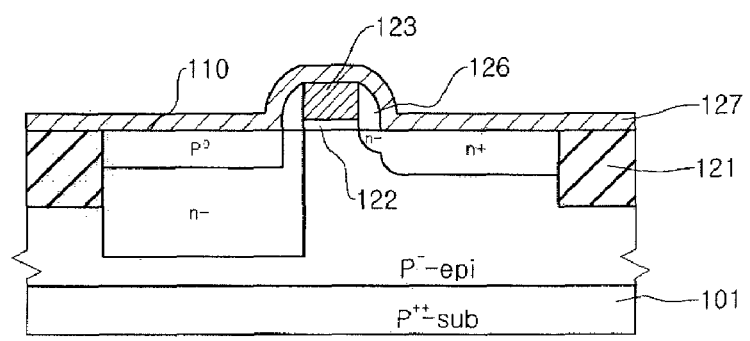

As illustrated in FIG. 3C, spacers 126 may formed at sidewalls of gate electrode 123, in accordance with embodiments. A p-type impurity area (po) may be selectively formed on the n-type impurity area (n−) for a photodiode. High density impurity ions may be selectively implanted through low density impurity area (LDD n−) 115 to form high density impurity area (n+) in a drain area of gate electrode 123.

Example FIG. 4 is a flowchart illustrating a process of forming a salicide blocking layer, in accordance with embodiments. As illustrated in example FIGS. 3D and 4, salicide blocking layer 127 (e.g. an oxide layer) may be formed on and/or over the entire surface of the p-type semiconductor substrate, including gate electrode 123 (step S100), in accordance with embodiments. As illustrated in example FIG. 3E, photoresist pattern 128 may be formed over salicide blocking layer 127 (step S110), in accordance with embodiments.

Figure 3E:
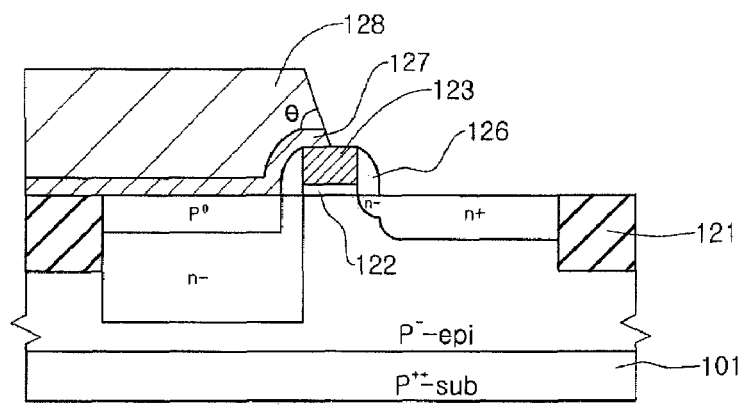

As illustrated in example FIGS. 3E and 4, an exposed portion of salicide blocking layer 127 may be etched using photoresist pattern 128 as an etch mask, in accordance with embodiments. Etching of salicide blocking layer 127 may expose a portion of salicide blocking layer 127 to expose at least a portion of gate electrode 123 and a source/drain area. In embodiments, photoresist pattern 128 may have an inclination angle less than 90° (e.g. an inclination angle between approximately 70° and approximately 80°) relative to the surface of the p-type semiconductor substrate.

Example FIG. 5 illustrates an exposure process of forming a photoresist pattern, in accordance with embodiments. Example FIG. 6 is a photographic view illustrating a photoresist pattern, according to embodiments. As illustrated in example FIG. 5, light may pass through lens 191 to selectively irradiate photoresist 195 through mask 193, in accordance with embodiments. Photoresist 185 may be formed on and/or over semiconductor substrate 197.

In embodiments, the top surface of photoresist 195 may be the best focus "0. A positive photoresist may be used as photoresist 195, in which a portion that absorbs light is removed by a developing solution. The depth of focus F of the light may be adjusted to be positioned below the top surface of the photoresist 195, while being distanced from the top surface of the photoresist 195 by approximately 0.3 μm to approximately 0.6 μm.

In embodiments, a photoresist pattern may be sloped, so that etchants can flow away from the salicide blocking layer when etching the salicide blocking layer. In embodiments, an eddy may be formed in the dent between the photoresist pattern and the salicide blocking layer caused by a centrifugal force, which may prevent undercutting from occurring. In embodiments, when a salicide blocking layer is etched, etchant may be sprayed on the semiconductor substrate while rotating the semiconductor substrate in a first direction (e.g. a right hand direction), thereby etching the salicide blocking layer (step S120).

In embodiments, a deionized (DI) water washing process may be performed to remove the etchant and impurities on and/or over the semiconductor substrate (step S130). The deionized (DI) water washing process may be a washing process using deionized water.

In embodiments, etchant may be sprayed on the semiconductor substrate while rotating the semiconductor substrate in a second direction (e.g. a left hand direction), to etch the salicide blocking layer (step S140). A DI washing process is performed in order to remove the etchant and impurities on the semiconductor substrate (step S150).

In embodiments, a wet etching process may be performed with respect to the semiconductor substrate while alternately rotating the semiconductor substrate in two different directions, thereby forming a salicide blocking layer and preventing or minimizing undercutting from occurring (S160). Photoresist pattern 128 may be removed (step S170).

Figure 3F:
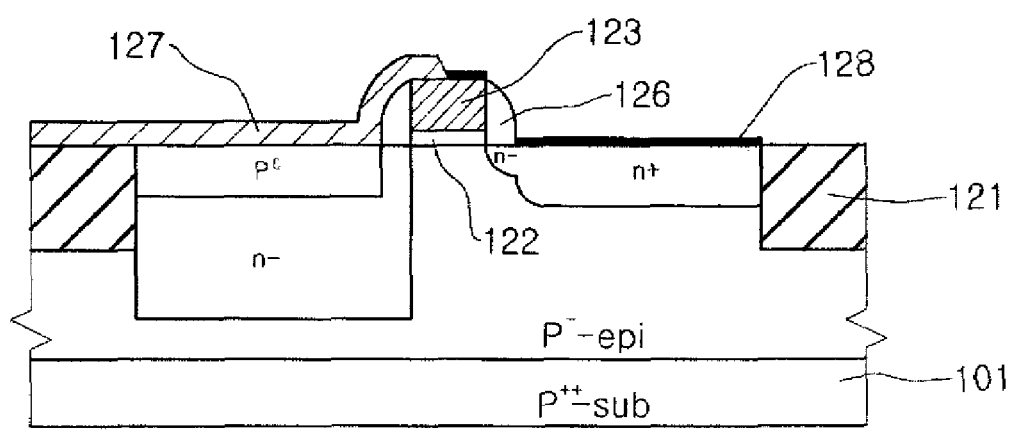

As illustrated in example FIGS. 3F and 4, after stacking a refractory metal layer on and/or over the surface of semiconductor substrate, a heat-treatment process may be performed with respect to the semiconductor substrate to form a salicide layer on the gate electrode 123 and the source/drain area in the semiconductor substrate (step S180). In embodiments, a portion of the refractory metal layer, which is not reacted, may be etched and removed from salicide blocking layer 127 in the area of a photodiode. Salicide blocking layer 127 may then be removed.

In embodiments, a salicide process may be employed to minimize the contact resistance and maximize the response speed of a CMOS image sensor. In embodiments, a method of manufacturing a CMOS image sensor may employ a salicide process that prevent or minimizes salicide from being formed in a photodiode area. In embodiments, a salicide blocking layer 127 (e.g. an oxide layer) may be formed on and/or over a surface of a semiconductor substrate and be selectively removed over gate electrode 123 and a source/drain area, on which salicide is to be formed.

A CMOS image sensor may be formed using a salicide forming process with the profile of a photoresist pattern and/or salicide blocking layer having a slope less than 90° (e.g. an inclination angle between approximately 70° and approximately 80°). A slope of a photoresist pattern and/or a silicide blocking layer may be adjusted through a photo process for patterning a salicide blocking layer. In embodiments, when a salicide blocking layer is etched, occurrence of an undercut phenomenon may be prevented or minimized, which may maximize a manufacturing process margin.

In embodiments, when a salicide blocking layer is patterned, an etching process may be performed while rotating the semiconductor substrate in two directions, to form a uniform pattern. In embodiments, since a salicide area may be separated and/or isolated from a non-salicide area, defects may be prevented or minimized, which may maximize characteristics and/or reliability of an image sensor.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. A method comprising:
forming a photodiode, a source/drain area, and a gate electrode over a semiconductor substrate;
forming a salicide blocking layer over the photodiode, the source/drain area, and the gate electrode;
forming a photoresist pattern over the salicide blocking layer, wherein a border of the photoresist pattern has an inclination angle less than 90° over the gate electrode and the photoresist pattern is formed over the photodiode;
etching the salicide blocking layer using the photoresist pattern as an etch mask; and
forming salicide on the source/drain area and the gate electrodes,
wherein said etching is wet-etching,
wherein said wet-etching comprises:
etching the salicide blocking layer while rotating the semiconductor substrate in a first direction; and
etching the semiconductor substrate while rotating the semiconductor substrate in a second direction, wherein the second direction is opposite to the first direction.

2. The method of claim 1, wherein the method is a method of manufacturing a CMOS image sensor.

3. The method of claim 1, wherein the inclination angle is between approximately 70° and approximately 80°.

4. The method of claim 1, comprising removing the photoresist layer before said forming the salicide.

5. The method of claim 1, wherein said wet-etching comprises performing at least one deionized water washing process.

6. The method of claim 1, wherein said forming the photoresist pattern having an inclination angle less than 90° comprises:
coating positive photoresist over the semiconductor substrate;
forming a mask over an upper portion of the positive photoresist;
performing an exposure process with respect to a resultant structure while forming depth of focus in the positive photoresist; and
developing the positive photoresist.

7. The method of claim 1, wherein the photodiode is in a non-salicide area.

8. The method of claim 1, wherein the source/drain area and the gate electrode are formed in a silicide area.

9. The method of claim 1, comprising:
defining an active area in the semiconductor substrate by an isolation layer;
sequentially stacking an oxide layer and a conductive layer for a gate electrode over the active area of the semiconductor substrate;
forming the gate electrode and a gate insulating layer by patterning the conductive layer and the oxide layer; and
forming at least one spacer on at least one sidewall of the gate electrode and implanting impurities into the source/drain area before said forming the salicide blocking layer.

10. The method of claim 1, wherein said photoresist pattern exposes at least a part of the gate electrode and the source/drain area.

11. The method of claim 1, wherein the border of the photoresist pattern exposes a portion of the salicide blocking layer.

12. The method of claim 1, wherein the salicide is formed at least a part of the gate electrode and the source/drain area.

13. The method of claim 6, wherein the depth of focus is located below a top surface of the positive photoresist.

14. The method of claim 13, wherein the depth of focus is between approximately 0.3 μm to 0.6 μm below the top surface of the positive photoresist.

15. An apparatus comprising:
a semiconductor substrate over which a photodiode, a source/drain area, and a gate electrode are formed;
a salicide blocking layer over formed the photodiode, the source/drain area, and the gate electrode; and
a photoresist pattern formed over the salicide blocking layer, wherein a border of the photoresist pattern which exposes a portion of the salicide blocking layer has an inclination angle less than 90° over the gate electrode,
wherein the salicide blocking layer is etched by wet-etching which comprises:
etching the salicide blocking layer while rotating the semiconductor substrate in a first direction; and
etching the semiconductor substrate while rotating the semiconductor substrate in a second direction, wherein the second direction is opposite to the first direction.

16. A method comprising:
forming a photodiode, a source/drain area, and a gate electrode over a semiconductor substrate;
forming a salicide blocking layer over the photodiode, the source/drain area, and the gate electrode;
forming a photoresist pattern over the salicide blocking layer;
etching the silicide blocking layer using the photoresist pattern as an etch mask while rotating the semiconductor substrate in a first direction;
etching the semiconductor substrate while rotating the semiconductor substrate in a second direction opposite to the first direction; and
forming salicide on the source/drain area and the gate electrode.

* * * * *